United States Patent [19]

Fukasawa et al.

[11] Patent Number: 4,963,240
[45] Date of Patent: Oct. 16, 1990

[54] SPUTTERING ALLOY TARGET AND METHOD OF PRODUCING AN ALLOY FILM

[75] Inventors: Yoshiharu Fukasawa; Mituo Kawai; Hideo Ishihara; Takenori Umeki; Yasuhisa Oana, all of Yokohama, Japan

[73] Assignee: Kabushiki Kaisha Toshiba, Kawasaki, Japan

[21] Appl. No.: 174,959

[22] Filed: Mar. 29, 1988

[30] Foreign Application Priority Data

Mar. 30, 1987 [JP] Japan ................................. 62-74410

[51] Int. Cl.$^5$ ............................................. C23C 14/34
[52] U.S. Cl. ......................... 204/192.15; 204/192.17; 204/298.13
[58] Field of Search ...................... 204/192.15, 192.17, 204/298 TS, 298 TC, 298.13, 298.12; 75/245, 248

[56] References Cited

U.S. PATENT DOCUMENTS

| | | | |
|---|---|---|---|
| 2,850,385 | 9/1958 | Nisbet | 75/176 |
| 3,984,208 | 10/1976 | Moulin et al. | 75/245 |
| 4,322,248 | 3/1982 | Patrician et al. | 75/245 |
| 4,430,190 | 2/1984 | Eilers et al. | 204/298 TS |
| 4,444,635 | 4/1984 | Kobayashi et al. | 204/192.15 |
| 4,613,371 | 9/1986 | Cheney et al. | 75/245 XR |
| 4,710,398 | 12/1987 | Homma et al. | 204/192.17 XR |

FOREIGN PATENT DOCUMENTS

| | | |
|---|---|---|
| 2838676 | 3/1979 | Fed. Rep. of Germany . |
| 61-116835 | 6/1986 | Japan . |
| 0170561 | 8/1986 | Japan .............................. 204/192.17 |

OTHER PUBLICATIONS

Rupert H. Myers, *Metallurgia*, "Some Properties of Tanalum-Rich Alloys With Wolfram and Molybdenum", vol. 42, 06/1950, pp. 3–9.

R. Kieffer, et al., *Journal of the Less-Common Metals*, "Tungsten Alloys of High Melting Point", vol. 1, Feb. 1959, pp. 19–33.

*Primary Examiner*—Nam X. Nguyen
*Attorney, Agent, or Firm*—Foley & Lardner, Schwartz, Jeffery, Schwaab, Mack, Blumenthal & Evans

[57] ABSTRACT

The present invention is a sputtering target for formation of an alloy film, which comprises 15 to 50 atomic percent of molybdenum or tungsten, the remaining atomic percent of tantalum, and concomitant impurities, which can provide electrical wiring having very low specific resistance as well as excellent workability and stability, whereby high definition and high integration of various elements such as semiconductor devices can be achieved. In consequence, it is fair to say that this invention is industrially very useful.

9 Claims, No Drawings

SPUTTERING ALLOY TARGET AND METHOD OF PRODUCING ON ALLOY FILM

BACKGROUND OF THE INVENTION

This invention relates to a sputtering target suitable for the formation of an alloy film for electrical wiring which is excellent in electrical conductivity, workability, oxide layer formation properties, and other characteristics.

In recent years, much attention has been paid to an active matrix type liquid crystal display device in which a thin film transistor (TFT) having an amorphous silicon (a-Si) film is used as a switching element.

When TFT arrays are formed by using an amorphous glass substrate and the a-Si film which can be formed at a low temperature, there can be provided a panel display (flat type television) having great area, high definition, high picture quality, as well as being inexpensive. In order to obtain the active matrix type liquid crystal display device having the finest possible picture elements and the greatest area, signal wiring extending to TFT, i.e., gate wiring and data wiring, must be thin and long.

For example, in the case of employing a reverse stagger type TFT structure which is constituted by superposing an insulating film and a a-Si film on the glass substrate having provided thereon gate electrode wiring, it is required that the gate electrode wiring be thin, have sufficiently low resistance, and withstand chemicals used in subsequent steps.

As raw materials for the gate electrodes which can satisfy such requirements, there have been heretofore used various metallic films of tantalum (Ta), titanium (Ti) and the like. However, in order to increase further the area and the definition of the liquid crystal display, raw material having lower electrical resistance, better workability and high resistance to various chemicals used in the subsequent chemical treatment steps is demanded.

Moreover, in the case of employing a stagger type TFT structure in which a drain and a source electrode wiring is disposed on the substrate, it is required that the drain and the source electrode wiring possess the above-mentioned characteristics.

On the other hand, a semiconductor integrated circuit using a single crystal Si substrate suffers similar problems. For example, an impurity-doped polycrystalline silicon film is usually used for the gate electrode wiring of an MOS transistor used in a memory integrated circuit typified by a dynamic RAM.

However, in order to achieve further microminiaturization and high integration of the elements, the polycrystalline silicon film has a specific resistance that is too high. As a raw material which has lower specific resistance than that of the polycrystalline silicon film and can withstand high temperatures, there are a molybdenum/silicide ($MoSi_2$) film and the like. However, when the dynamic RAM or the like of 1 M bit or more is to be realized by use of this molybdenum/silicide film, resistance of the electrode wiring increases disadvantageously.

In a semiconductor device using a conventional a-Si film, a single crystal Si substrate or the like, in order to achieve further microminiaturization and high integration of the elements, resistance of the electrode wiring increases disadvantageously. Moreover, raw materials for the electrode wiring are required to have excellent workability, high resistance to various treatments, and good and stable ohmic contact properties with Si, in addition to the low specific resistance.

SUMMARY OF THE INVENTION

This invention has been developed in view of the above situations, and an object of this invention is to provide a sputtering target suitable for the formation of an alloy film which is excellent in electrical conductivity, workability, oxide film formation properties, and other characteristics.

The present inventors have conducted experiments and systematically examined various metallic and alloy films eligible for electrical wiring materials of semiconductor devices using a-Si films, polycrystalline silicon films, single crystal Si substrates and the like. As a result, it has been found that an electrical wiring film for the semiconductor devices has been obtained which has much lower electrical resistance than a single film of Ta (tantalum), Mo (molybdenum) or W (tungsten) in a limited composition range of Ta and Mo or W and which is excellent in workability, formation properties of an oxide film, ohmic contact properties with silicon, and the like required for the films for electrical wiring. In addition, it has also been found that sputtering is suitable for the formation of the films for the electrical wiring of the semiconductor devices, and this invention has been completed on the basis of the above knowledge.

That is, this invention is directed to a sputtering target for foming an alloy film, which comprises 15 to 50 atomic percent of molybdenum or tungsten, the remaining atomic percent of tantalum, and concomitant impurities.

DESCRIPTION OF THE PREFERRED EMBODIMENTS

Now, reference will be made to the alloy film formed by the sputtering target of this invention. In the composition of the alloy film formed by the sputtering, when the Ta content is less than 30 atomic percent, electrical resistance of the alloy film is high, and formation properties of the oxide film and washability with a mixed solution are bad. Conversely, when the Ta content is in excess of 95 atomic percent, the electrical resistance is liable to be high, though workability, oxide film formation property and washability with the mixed solution are satisfactory.

In the composition of the formed alloy film, Ta is preferably present in a ratio of 30 to 80 atomic percent, more preferably 50 to 80 atomic percent.

The desirable composition of this target for the formation of the alloy film is composed of, as mentioned above, 15 to 50% atomic percent of Mo or W and the remaining atomic percent of Ta, and concomitant impurities.

As the forms of the sputtering targets, there are an alloy target prepared by melting Mo or W and Ta and then making an alloy from the resulting melt; a sintered target prepared by mixing Mo or W powder with Ta powder and then molding and sintering the mixture; and a composite target prepared by combining an Mo or W member and a Ta member in a predetermined area ratio.

The reason why each of the above targets is used is as follows: The alloy target has the advantage of yielding uniform alloy film by forming an alloy of Ta and Mo or W since they have different sputtering efficiency respectively. Moreover, the alloy target can be prepared in relatively few process steps. In the preparing process of the alloy target, melting the alloy may be preferably carried out by use of electron beams or arc melt.

In case of the sintered target, the target has the advantage of yielding a uniform alloy film to be formed by mixing Ta and Mo or W powders, followed by sintering, having relatively less uniformity since they have different sputtering efficiency respectively. Moreover, the sintered target can be prepared in a relatively small number of process steps.

Moreover, when the composite target is to be used, materials are easily available since a Ta plate and an Mo or W plate can be used as such, and the alloy film to be obtained contains less oxygen gas component generated due to the nature of Ta than in the case of the sintered target.

In the sputtering target for electrical wiring regarding this invention, impurities such as carbon, nitrogen, hydrogen and oxygen are contained preferably in a minimum quantity, but their content of 5 atomic percent or less is allowable.

EXAMPLES 1 to 6

Alloy targets were prepared from Mo or W and Ta having a purity of 99.9% by melting alloys, which were different in contents of Mo or W and Ta, by means of electron beams and then molded with the aid of a machine.

Afterward, sputtering was carried out in an argon atmosphere at room temperature by use of the thus prepared alloy targets, and various tests were then carried out to inspect electrical resistance, workability by dry etching, oxide film formation properties and the like.

The results are set forth in Table 1.

COMPARATIVE EXAMPLES 1 to 9

For comparison, titanium, chromium, molybdenum, tantalum and MoSi$_2$ having a purity of 99.9% were subjected to sputtering and tested to inspect characteristics in the same manner in the Examples 1 to 4. The results are also set forth in Table 1.

particular, the alloy films formed by the targets containing 70 atomic percent or less of Ta had lower specific resistances than that of the films formed by pure Mo target. Moreover, when heat treatment was carried out after deposition, the specific resistances of the alloy films was further decreased.

Also with regard to the workability by dry etching, the alloy films of this invention were excellent in common with the MoSi$_2$ films, and the taper work of these alloy films was easily carried out. In addition, good hot oxide films could be formed on the alloy films of this invention, but the films of Mo, Ti and Cr and so on did not permit the formation of such good hot oxide films thereon.

The alloy films of this invention were also excellent in resistance to an $H_2SO_4 + H_2O_2$ mixed solution which was extensively used as a washing liquid. Moreover, the alloy films of this invention had excellent properties of ohmic contact with Si and low reactivity with an SiO$_2$ film. It was also confirmed that the alloy films of this invention were fit for semiconductor devices using Si.

In the above table, the estimation of 0 (excellent), Δ (good) and X (bad) were made as follows: The workability of the films was evaluated by determining if CF$_4$ dry etching is feasible, whereas the tapering workability was evaluated by determining by means of CF$_4$ dry etching again if taper angle can be controlled thereby.

The formation properties of the hot oxide films were evaluated from formation results of the oxide films having no pinholes at a temperature of about 400° C. and having electrical strength to a voltage of $3 \times 10^5$ V/cm or more and a leakage current of $1 \times 10^{-10}$ A/mm$^2$ or less. The formation properties of the anode oxide film was evaluated from the formation results of the oxide films having no pinholes and having resistance to a voltage of $3 \times 10^6$ V/cm or more and a leakage current of $1 \times 10^{-10}$ A/mm$^2$ or less. Furthermore, the ohmic contact properties with silicon were evaluated by reactivity at a temperature of about 400° C.

In certain electrode materials for the semiconductor device, there are required hot oxide film or anode oxide film formation, the washing treatment with a mixed solution containing a strong acid and the like. As indi-

TABLE 1

| | | Example | | | | | | Comparative Example | | | | | | | | |
|---|---|---|---|---|---|---|---|---|---|---|---|---|---|---|---|---|
| | | 1 | 2 | 3 | 4 | 5 | 6 | 1 | 2 | 3 | 4 | 5 | 6 | 7 | 8 | 9 |
| | | | | | | | | Ta—Mo,Ta—W Series | | | | Pure Metal, Silicide | | | | |
| Composition of Target | Mo (at %) | 50 | 40 | 30 | 20 | — | — | 90 | 80 | 75 | 2 | | | | | |
| | W (at %) | — | — | — | — | 40 | 50 | — | — | — | — | Ti | Cr | Mo | Ta | MoSi$_2$ |
| | Ta (at %) | 50 | 60 | 70 | 80 | 60 | 50 | 10 | 20 | 25 | 98 | | | | | |
| Specific Resistance ($\times 10^{-5} \Omega \cdot$ cm) | Immediately after deposition | 3.8 | 4.5 | 5.2 | 6.5 | 4.4 | 3.7 | 5.2 | 5.1 | 4.9 | 14 | 47 | 13 | 5.3 | 26 | 91 |
| | After Heat Treatment at 300° C. | 3.5 | 4.1 | 4.9 | 6.1 | 4.0 | 3.4 | 5.0 | 4.9 | 4.7 | 10 | 46 | 13 | 5.0 | 22 | 99 |
| | After Heat Treatment at 1000° C. | 1.5 | 2.0 | 2.4 | 3.3 | 1.9 | 1.5 | 4.4 | 4.3 | 4.0 | 8.0 | 45 | 13 | 4.5 | 20 | 75 |
| Workability by Dry Etching | | O | O | O | O | O | O | O | O | O | O | Δ | Δ | O | O | O |
| Tapering Workability | | O | O | O | O | O | O | O | O | O | O | Δ | X | O | O | O |
| Formation of Hot Oxide Film | | O | O | O | O | O | O | X | X | Δ | O | X | X | X | O | O |
| Formation of Anode Oxide Film | | O | O | O | O | O | O | X | X | Δ | O | X | X | X | O | O |
| Washing with Mixed Solution of H$_2$SO$_4$ + H$_2$O$_2$ | | O | O | O | O | O | O | X | X | X | O | X | O | X | O | O |
| Ohmic Contact with Silicon | | O | O | O | O | O | O | O | O | O | O | X | X | O | O | O |
| Non-reactivity with SiO film | | O | O | O | O | O | O | Δ | Δ | O | O | Δ | Δ | Δ | O | O |

As can be clearly seen from the table 1, the alloy films formed by the targets of this invention had lower specific resistances than films of Ti, Cr, Ta, MoSi$_2$ and in cated in Table 1, their formation and treatment on the conventional Mo electrodes were poor, and their formation and treatment on the Ta electrodes were satisfactory but these electrodes had high specific resistance inconveniently.

On the contrary, the sputtering target of this invention can form hot oxide films and anode oxide films if it contains 30 atomic percent or more. The alloy films obtained can be subjected to strong acid effectively and can have much lower specific resistance than that of the Ta electrodes. The alloy films in which Ta was contained in a ratio of 95 atomic percent or less had lower specific resistance than that of the Mo electrodes. Especially, the results in Table 1 indicate that even when not subjected to the heat treatment, the films in which Ta was present in a ratio of 70 atomic percent or less had lower specific resistance than that of the Mo electrodes.

EXAMPLES 7 and 8.

Commercially available Mo powder or W powder and Ta powder having a purity of 99.9% were sintered by a vacuum hot press and then machined to prepare sinter targets.

Afterward, sputtering was carried out using these targets in an argon atmosphere at room temperature, and various tests were then performed to inspect electrical resistance, workability, oxide film formation properties, and the like. The results are set forth in Table 2.

TABLE 2

|  |  | Example | |
|---|---|---|---|
|  |  | 7 | 8 |
| Composition of | Mo(at %) | 40 | — |
| Target | W (at %) | — | 40 |
|  | Ta (at %) | 60 | 60 |
| Specific Resistance ($\times 10^{-5}$ $\Omega \cdot$ cm) | Immediately after deposition | 5.0 | 4.8 |
|  | After Heat Treatment at 300° C. | 4.5 | 4.2 |
|  | After Heat Treatment at 1000° C. | 2.3 | 2.1 |
| Workability by Dry Etching |  | 0 | 0 |
| Tapering Workability |  | 0 | 0 |
| Formation of Hot Oxide Film |  | 0 | 0 |
| Formation of Anode Oxide Film |  | 0 | 0 |
| Washing with Mixed Solution of $H_2SO_4 + H_2O_2$ |  | 0 | 0 |
| Ohmic Contact with Silicon |  | 0 | 0 |
| Non-reactivity with SiO film |  | 0 | 0 |

EXAMPLE 9

Moreover, Mo plates and Ta plates which are cut out from Mo block and Ta block, respectively, each having a purity of 99.9% were combined to prepare various composite targets by changing area ratios of the Ta plates to the Mo plates.

Afterward, sputtering was carried out using these composite targets in an argon atmosphere at room temperature, and various tests were then performed to inspect electrical resistance, workability, oxide film formation properties, and the like. According to the results, they had good characteristics, as in the alloy targets.

As described above, the sputtering target of this invention can provide electrical wiring having very low specific resistance as well as excellent workability and stability, whereby high definition and high integration of various elements such as semiconductor devices can be achieved. In consequence, it is fair to say that this invention is industrially very useful.

What is claimed is:

1. A method of producing an alloy film, comprising the steps of:
    forming a sputtering target comprising from 15 to 50 atomic percent of molybdenum or tungsten, the remaining atomic percent of tantalum, and concomitant impurities; and
    sputtering an alloy film on a substrate using said sputtering target.

2. A method as claimed in claim 1, wherein the sputtering target is an alloy target comprising 15 to 50 atomic percent of molybdenum or tungsten, the remaining atomic percent of tantalum, and concomitant impurities.

3. A method as claimed in claim 2, wherein the substrate is a semiconductor and the alloy film is patterned to produce a wiring pattern.

4. A method as claimed in claim 1, wherein the sputtering target is a sintered target comprising a sintered powder material comprising 15 to 50 atomic percent of molybdenum or tungsten, the remaining atomic percent of tantalum, and concomitant impurities.

5. A method as claimed in claim 4, wherein the substrate is a semiconductor and the alloy film is patterned to produce a wiring pattern.

6. A method as claimed in claim 1, wherein the sputtering target comprises a composite target having areas of tungsten or molybdenum and areas of tantalum in which the area ratio of molybdenum or tungsten to tantalum is adjusted so that the atomic percentage of the molybdenum or tungsten in the alloy film is 15 to 50% and the residue is tantalum and concomitant impurities.

7. A method as claimed in claim 6, wherein the substrate is a semiconductor and the alloy film is patterned to produce a wiring pattern.

8. A method as claimed in claim 1, wherein the substrate is a semiconductor and the alloy film is patterned to produce a wiring pattern.

9. A sputtering target for formation of an alloy film, comprising a composite target having areas of molybdenum or tungsten and areas of tantalum, in which the area ratio of molybdenum or tungsten to tantalum is adjusted so that the atomic percentage of molybdenum or tungsten in the alloy film is 15 to 50% and the remaining atomic percentage is tantalum and concomitant impurities.

* * * * *